US008201032B2

United States Patent
Evans et al.

(10) Patent No.: US 8,201,032 B2
(45) Date of Patent: Jun. 12, 2012

(54) GENERALIZED BIST FOR MULTIPORT MEMORIES

(75) Inventors: Donald A. Evans, Lancaster, OH (US); Ilyoung Kim, Skillman, NJ (US)

(73) Assignee: Agere Systems Inc., Allentown, PA (US)

( * ) Notice: Subject to any disclaimer, the term of this patent is extended or adjusted under 35 U.S.C. 154(b) by 411 days.

(21) Appl. No.: 11/775,956

(22) Filed: Jul. 11, 2007

(65) Prior Publication Data

US 2008/0016418 A1 Jan. 17, 2008

Related U.S. Application Data

(62) Division of application No. 10/974,450, filed on Oct. 27, 2004, now abandoned.

(51) Int. Cl.
*G11C 29/00* (2006.01)
*G01R 31/28* (2006.01)
*G06F 7/02* (2006.01)
*G06F 17/50* (2006.01)

(52) U.S. Cl. ........ 714/718; 714/733; 714/734; 714/819; 716/51

(58) Field of Classification Search .................. None
See application file for complete search history.

(56) References Cited

U.S. PATENT DOCUMENTS

| | | | |
|---|---|---|---|
| 6,070,256 A | 5/2000 | Wu et al. | |
| 6,486,493 B2 | 11/2002 | Arimoto et al. | |
| 6,667,918 B2 | 12/2003 | Leader et al. | |
| 6,681,358 B1 * | 1/2004 | Karimi et al. | 714/733 |
| 6,795,943 B2 * | 9/2004 | Sato et al. | 714/718 |
| 6,907,555 B1 | 6/2005 | Nomura et al. | |

OTHER PUBLICATIONS

Restriction Requirement; Mailed on Aug. 28, 2006 for corresponding U.S. Appl. No. 10/974,450, filed Oct. 27, 2004; 5 pages.
Non-Final Office Action; Mailed on Dec. 15, 2006 for corresponding U.S. Appl. No. 10/974,450, filed Oct. 27, 2004; 13 pages.
Final Office Action; Mailed on May 10, 2007 for corresponding U.S. Appl. No. 10/974,450, filed Oct. 27, 2004; 10 pages.

* cited by examiner

*Primary Examiner* — Christine Tu
(74) *Attorney, Agent, or Firm* — Mendelsohn, Drucker & Associates, P.C.; Steve Mendelsohn (57) ABSTRACT

A generalized hardware architecture that supports built-in self testing (BIST) for a range of different computer memory configurations and a generalized BIST algorithm can be compiled, based on specified configuration characteristics (e.g., the number of write ports, the number of read ports, the number of entries, and the number of bits per entry in the computer memory), to generate the hardware design for a particular computer memory system. In one embodiment, the generalized hardware architecture includes a multiplexer block that enables a single BIST comparator to be multiplexed for use in performing BIST testing via different read ports of the computer memory.

23 Claims, 6 Drawing Sheets

| PARAMETER | DESCRIPTION | LIMIT | | |
|---|---|---|---|---|
| | | INCREMENT | MINIMUM | MAXIMUM |
| W | WORDS<br>$2 \leq N \leq 18$<br>$19 \leq N \leq 36$<br>$37 \leq N \leq 72$ | 16<br>8<br>4 | 16<br>8<br>4 | 4096<br>2048<br>1024 |
| N | BITS/ENTRY | 1 | 2 | 72 |
| M | ADDRESS BITS<br>$2 \leq N \leq 18$<br>$19 \leq N \leq 36$<br>$37 \leq N \leq 72$ | 1<br>1<br>1 | 4<br>3<br>2 | 12<br>11<br>10 |
| PW+PR | PORTS | 1 | 2 | 5 |
| PW | WRITE PORTS | 1 | 1 | 4 |
| PR | READ PORTS | 1 | 1 | 4 |

TABLE I

| TABLE II. PHASE 302: MEMORY CELL AND READ PORT DECODER TESTING ||
|---|---|
| STEP | CODE |
| 1 | $\Uparrow w_0^{10}$ |
| 2 | $\Uparrow R_0^{10} w_0^{01} R_{0,1,2,3}^{01}$ |
| 3 | $\Downarrow R_0^{01} w_0^{10} \| \| BD R_0^{10} w_0^{01}$ |
| 4 | $\Downarrow R_0^{01} w_0^{10} R_{0,1,2,3}^{10}$ |
| 5 | $\Uparrow R_0^{10} w_0^{01} \| \| BD R_0^{01} w_0^{10}$ |
| 6 | $\Uparrow R_0^{10}$ |

FIG. 4B

| TABLE III. PHASE 304: WRITE PORT DECODER TESTING ||
|---|---|
| STEP | CODE |
| 1 | $\Uparrow R_0^{10} w_{1,2,3}^{01}$ |
| 2 | $\Downarrow R_0^{01} w_{1,2,3}^{10}$ |

FIG. 4C

| STEP | CODE |
|---|---|
| TABLE IV. PHASE 306: BIT-WRITE ENABLING AND COMPARATOR TESTING || 
| 1 | $W^{10}_{0,1,2,3}$ WITH BW=(...0101) |
| 2 | $R^{11}_0$ |
| 3 | $W^{01}_{0,1,2,3}$ WITH BW=(...1111) |
| 4 | $R^{10}_0$ |
| 5 | $W^{10}_{0,1,2,3}$ WITH BW=(...1010) |
| 6 | $R^{11}_0$ |
| 7 | $W^{10}_{0,1,2,3}$ WITH BW=(...1111) |
| 8 | $R^{01}_0$ |

US 8,201,032 B2

GENERALIZED BIST FOR MULTIPORT MEMORIES

CROSS-REFERENCE TO RELATED APPLICATIONS

This is a divisional of application Ser. No. 10/974,450, filed on Oct. 27, 2004, now abandoned, the teachings of which are incorporated herein by reference.

BACKGROUND OF THE INVENTION

1. Field of the Invention

The present invention relates to built-in self-testing (BIST) for computer memories, and, in particular, to BIST testing for multiport memories.

2. Description of the Related Art

BIST testing refers to testing implemented by on-chip circuitry to verify the proper operation of a computer memory. BIST testing typically involves (1) writing known data into specific locations within a computer memory, (2) reading that data from those memory locations, and (3) comparing the read data with the expected (known) data to determine whether they are identical. If the read data does not match the expected data, then something in the computer memory architecture is not working properly. BIST testing can be designed to verify the proper operation of each memory cell in the computer memory, each write-address decoder used to write data into the computer memory, and each read-address decoder used to read data from the computer memory.

A wide variety of different types of computer memories are possible. In particular, different computer memories may have different numbers of bits per entry (i.e., bits per word or row), different numbers of entries, different numbers of write ports through which data can be written into the memories, and/or different numbers of read ports through which data can be read from the memories. In the past, BIST hardware and a corresponding BIST algorithm would be manually designed on a case-by-case basis for each different type of computer memory having a specific set of configuration characteristics (e.g., bits per entry, number of entries, number of write ports, and number of read ports).

A typical BIST hardware design relies on a different comparator for each different read port. That is, data read from the computer memory via a particular read port is forwarded to a corresponding comparator that processes data read from the memory via only that read port.

SUMMARY OF THE INVENTION

In one embodiment, the present invention is a method for designing BIST circuitry for testing a memory having one or more write ports and one or more read ports. According to the method, one or more values are assigned for one or more memory configuration parameters for the memory, and a generic BIST algorithm is compiled based on the one or more memory configuration parameters to generate a design for the BIST circuitry.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

Generalized BIST Architecture

FIG. 1 shows a block diagram of a generalized architecture 100 for computer memories that support BIST testing. Architecture 100 enables BIST testing of multiport memories having any number of write ports (i.e., ports via which data can be written to memory block 102) and up to four read ports (i.e., ports via which data can be read from memory block 102). Note that any given port may be either a write-only port, a read-only port, or a read/write port capable of supporting both write and read operations. As explained later, in theory, architecture 100 can be extended to support any number of read ports.

Figure 1A:
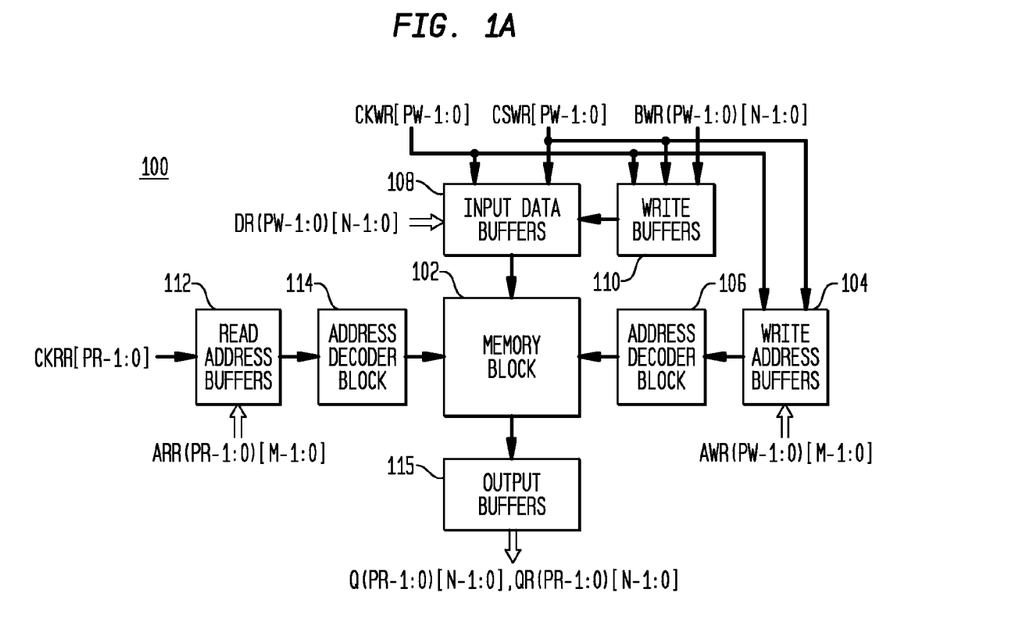
FIG. 1 shows a block diagram of a generalized architecture for computer memories that support BIST testing.

Referring to FIG. 1A, memory block 102 is a two-dimensional (2D) computer memory having up to W rows of data (i.e., words or entries), each row of data (i.e., word or entry) having N bits, where PW is the number of write ports in memory block 102 (numbered write port 0 through write port PW−1), and PR is the number of read ports (numbered read port 0 through read port PR−1). Memory block 102 may be implemented as a two-dimensional array of memory cells having W rows and N columns, in which cells are accessed (i.e., written to or read from) using corresponding word (i.e., row) lines and bit (i.e., column) lines. Each different row of memory block 102 can be represented by a unique M-bit address.

Figure 2:
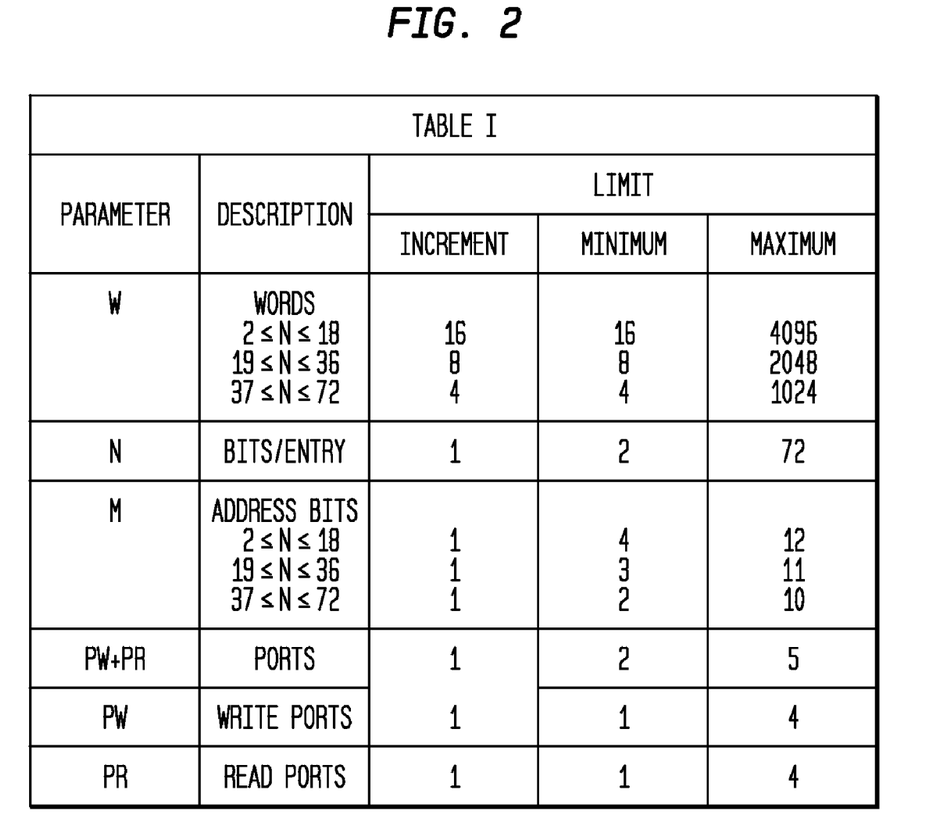
FIG. 2 shows Table I, which presents the relationships between various memory configuration characteristics, according to one possible scheme for implementing the computer memory of FIG. 1.

Table I in FIG. 2 shows the relationship between the number of rows of data (W), the number of bits per row (N), and the number of address bits (M) for memory block 102, according to one possible scheme for implementing memory block 102. According to Table I, depending on the particular implementation, memory block 102 can have anywhere from 2 to 72 bits per entry (N). When memory block 102 has 2 to 18 bits/entry, the number of entries (W) in memory block 102 can be anywhere from 16 to 4096 in 16-entry increments (i.e., memory block 102 can be implemented with either 16, 32, 48, ..., or 4096 entries). Similarly, when memory block 102 has 19 to 36 bits/entry, the number of entries can be anywhere from 8 to 2048 in 8-entry increments, and, lastly, when memory block 102 has 37 to 72 bits/entry, the number of entries can be anywhere from 4 to 1024 in 4-entry increments.

In addition, when memory block 102 has 2 to 18 bits/entry, the number of bits per row address (M) ranges from 4 to 12. Similarly, when memory block 102 has 19 to 36 bits/entry, the number of bits per row address ranges from 3 to 11, and, lastly, when memory block 102 has 37 to 72 bits/entry, the number of bits per row address ranges from 2 to 10.

Referring again to FIG. 1A, write address buffers 104 receive write address data AWR(PW−1:0)[M−1:0], where (PW−1:0) indicates PW different write addresses, one each for write port 0 through write port PW−1, and [M−1:0] indicates that each write address is an M-bit value. Write address decoder block 106 decodes each M-bit write address value into a signal that energizes a particular word line in memory block 102 to enable data to be written to the cells of that particular row of memory block 102.

Input data buffers 108 receive input data DR(PW−1)[N−1:0] to be written into memory block 102. Write buffers 110 receive write port clock signals CKWR[PW−1:0], write chip select signals CSWR[PW−1:0], and bit-write enable signals BWR(PW−1:0)[N−1:0]. Each write port clock signal CKWR controls the timing of the writing of data into memory block 102 through the corresponding write port. Each chip select signal CSWR indicates whether or not the corresponding write port is enabled (i.e., turned on) and therefore able to receive input data. Each N-bit bit-write enable signal BWR indicates the bits of the corresponding entry that are enabled to be overwritten through the corresponding write port. The write port clock signals CKWR and write chip select signals CSWR are also applied and used to control write address buffers 104 and input data buffers 108.

Read address buffers 112 receive read address data ARR(PR−1:0)[M−1:0] (i.e., a different M-bit read address ARR for each of the PR different read ports). Read port clock signals CKRR[PR−1:0] control the timing of the reading of data from memory block 102 for the PR different read ports. Read address decoder block 114 decodes each M-bit read address value into a signal that energizes a particular word line in memory block 102 to enable data to be read from the cells of that particular row of memory block 102. Output buffers 115 receive output data read from memory block 102 and present two copies of that output data: Q(PR−1:0)[N−1:0] and QR(PR−1:0)[N−1:0], where Q is a copy of the output data that is made available to circuitry external to memory architecture 100, and QR is an identical copy of that output data, which is used internally in memory architecture 100, as described below with reference to FIG. 1C.

Figure 1B:
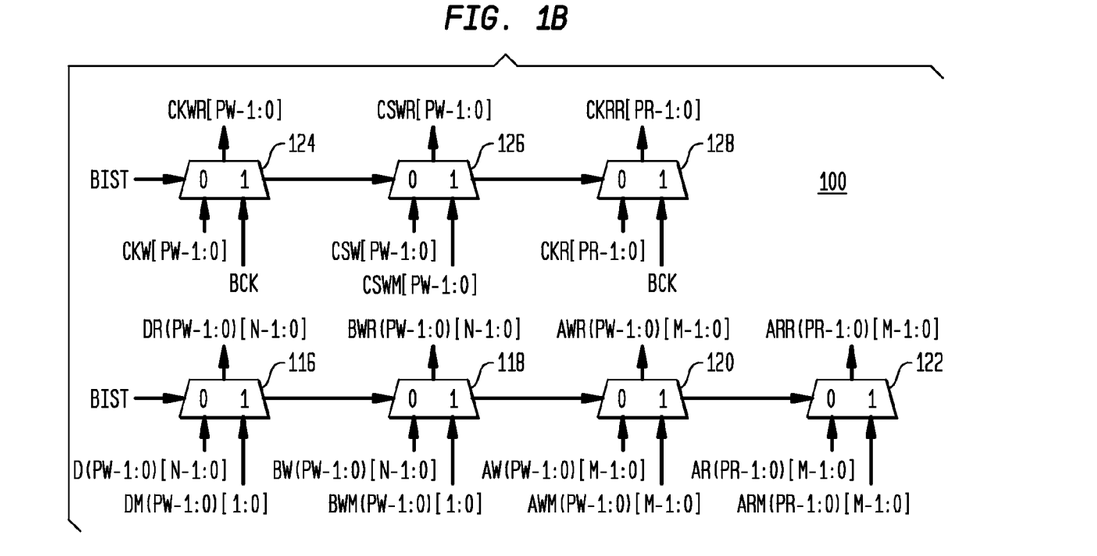

FIG. 1B shows a set of seven multiplexer (mux) blocks that are used to provide the above-described data and signals to the different elements shown in FIG. 1A. In general, each mux block receives two different sets of inputs: one set associated with "user" data activities of writing and/or reading application data to and from memory block 102 and the other set associated with BIST testing. Each mux also receives a one-bit BIST interface enable signal (BIST) from BIST controller 144 of FIG. 1D (e.g., implemented as a finite state machine (FSM)). When BIST=0, each mux block selects and presents its "user" input(s) at its output(s). When BIST=1, each mux block selects and presents its "BIST" input(s) at its output(s). In general, user data and signals are received by memory architecture 100 from circuitry external to memory architecture 100, while BIST data and signals are generated internally by BIST controller 144.

In particular, input data mux block 116 receives (i) user data D(PW−1:)[N−1:0] and (ii) BIST data DM(PW−1:0)[1:0] and selects and presents one of those sets of data (depending on the value of BIST) as input data DR to input data buffers 108 of FIG. 1A. Note that BIST data DM has only two bits of data for each write port. In this particular implementation of BIST testing, the first bit (i.e., bit 0) of BIST data DM identifies the value for all even bits of an N-bit input data word, while the second bit (i.e., bit 1) of BIST data DM identifies the value for all odd bits. For example, for a memory architecture having 8-bit words, a BIST data value DM of (00) represents the 8-bit word value of (00000000), a BIST data value DM of (01) represents the 8-bit word value of (01010101), a BIST data value DM of (10) represents the 8-bit word value of (10101010), and a BIST data value DM of (11) represents the 8-bit word value of (11111111), where the right-most bit is the least-significant bit (LSB) in the word (i.e., even bit 0) and the left-most bit is the most-significant bit (MSB) (i.e., odd bit N−1). The expansion of the two-bit BIST data values DM to the N-bit data values DR is implemented within input data mux block 116. Alternative implementations of BIST testing do not necessarily need to be constrained in this two-bit manner. In general, other constraints may be applied or even no constraints.

Similarly, bit-write enable mux block 118 receives (i) user bit-write enable signals BW(PW−1:)[N−1:0] and (ii) BIST bit-write enable signals BWM(PW−1:)[1:0] and presents bit-write enable signals BWR(PW−1:)[N−1:0] to the circuitry of FIG. 1A. Here, the two-bit BIST bit-write enable signals BWM indicate that, for BIST testing, all of the even bits are enable/disabled together, and all of the odd bits are enabled/disabled together.

Write address mux block 120 receives (i) user write address data AW(PW−1:0)[M−1:0] and (ii) BIST write address data AWM(PW−1:0)[M−1:0] and presents write address data AWR(PW−1:0)[M−1:0] to write address buffers 104 of FIG. 1A.

Read address mux block 122 receives (i) user read address data AR(PR−1:0)[M−1:0] and (ii) BIST read address data ARM(PR−1:0)[M−1:0] and presents read address data ARR(PR−1:0)[M−1:0] to read address buffers 112 of FIG. 1A.

Write clock mux block 124 receives (i) user write clock signals CKW[PW−1:0] and (ii) BIST write clock signal BCK and presents write clock signals CKWR[PW−1:0] to the circuitry of FIG. 1A. The expansion of the single BIST write clock signal BCK to the PW write clock signals CKWR is implemented within write clock mux block 124.

Write chip select mux block 126 receives (i) user write chip select signals CSW[PW−1:0] and (ii) BIST chip select signals CSWM[PW−1:0] and presents write chip select signals CSWR[PW−1:0] to the circuitry of FIG. 1A.

Read clock mux block 128 receives (i) user read clock signals CKR[PR−1:0] and (ii) BIST clock signal BCK and presents read clock signals CKRR[PR−1:0] to read address buffers 112 of FIG. 1A. The expansion of the single BIST clock signal BCK to the PR read clock signals CKRR is implemented within read clock mux block 128.

Figure 1C:
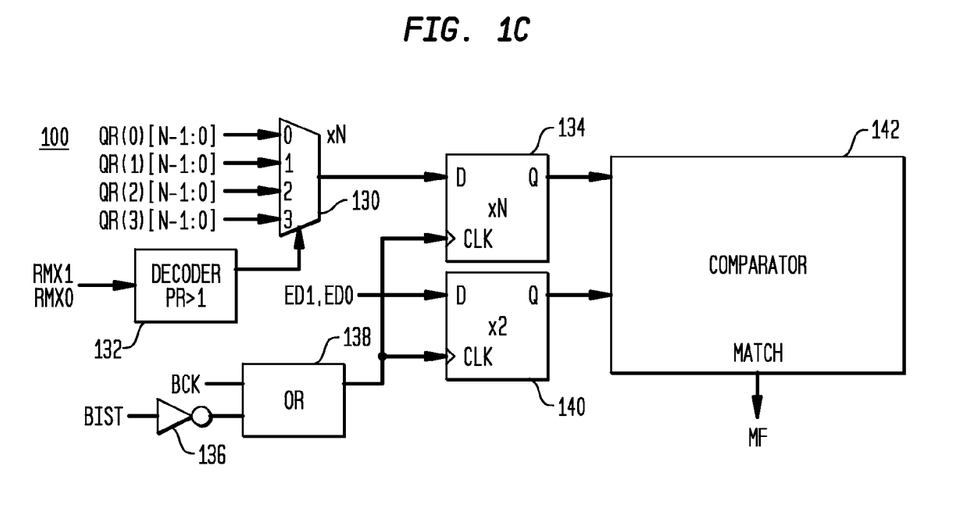

FIG. 1C shows the circuitry used to process the output data QR read from memory block 102, e.g., during BIST testing. As mentioned previously, architecture 100 supports memory blocks having up to four read ports. This limitation is dictated by the circuitry of FIG. 1C. In particular, BIST output data mux block 130 has four inputs 0, 1, 2, and 3, where mux block input 0 receives output data QR(O)[N−1:0] from read port 0, mux block input 1 receives output data QR(1)[N−1:0] from read port 1, mux block input 2 receives output data QR(2)[N−1:0] from read port 2, and mux block input 3 receives output data QR(3)[N−1:0] from read port 3. As indicated in FIG. 1C by the adjacent label "×N", BIST output data mux block 130 may be implemented, for example, using N one-bit 4:1 muxes or one N-bit 4:1 mux (although other implementations are also possible).

Figure 1D:
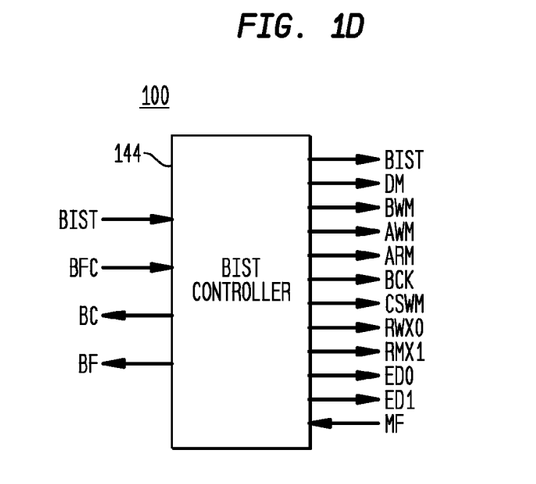

BIST output data mux block 130 is controlled by a control signal generated by mux decoder 132 based on two one-bit control signals (RMX0 and RMX1) received from BIST controller 144 of FIG. 1D. When MRX0=0 and RMX1=0, mux decoder 132 instructs BIST output data mux block 130 to select and present output data QR(0)[N−1:0] at its output. Similarly, when MRX0=1 and RMX1=0, mux decoder 132 instructs BIST output data mux block 130 to select output data QR(1)[N−1:0]. When MRX0=0 and RMX1=1, mux decoder 132 instructs BIST output data mux block 130 to select output data QR(2)[N−1:0]. Lastly, when MRX0=1 and RMX1=1, mux decoder 132 instructs BIST output data mux block 130 to select output data QR(3)[N−1:0].

In alternative embodiments, a memory architecture analogous to architecture 100 could be implemented with (1) a BIST data mux having one or more additional inputs and (2) a decoder designed to receive one or more additional one-bit control signals. In that case, the memory architecture could support memory blocks having more than four read ports.

The output from BIST output data mux block 130 is applied to the data input port D of register (e.g., flip-flop) block 134. Here, too, the label "×N" indicates that register block 134 may be implemented, for example, using N one-bit registers or one N-bit register (although other implementations are also possible). Similarly, the data input port D of register block 140 receives two one-bit expected data values ED0 and ED1 from BIST controller 144 of FIG. 1D, where ED0 identifies the expected value of the even bits in the output data QR read from memory block 102, and ED1 identifies the expected value of the odd bits. Here, the label "×2" indicates that register block 140 may be implemented using two one-bit registers or one two-bit register.

The data output ports Q of register blocks 134 and 140 are connected to provide inputs to comparator 142. Comparator 142 (i) compares the N bits of output data from register block 134 to an N-bit expected data value generated by expanding the two bits of expected data from register block 140 and (ii) generates a one-bit match flag MF. The expansion of the two bits of expected data to N-bit expected data values is performed within comparator 142. Match flag MF is 1, when each bit in the N-bit output data word is identical to the corresponding bit in the N-bit expected data word. Match flag MF is 0, when at least one bit in the N-bit output data word is different from the corresponding bit in the N-bit expected data word.

Register blocks 134 and 140 propagate data from their data input ports D to their data output ports Q based on the rising edges (or, alternatively, the falling edges) in signals received at their clock input ports CLK from OR block 138. OR block 138 applies a logical "OR" operation to its two inputs: (1) BIST clock signal BCK and (2) an inverted version of BIST interface enable signal BIST from inverter block 136. When BIST testing is disabled, BIST is 0, and the output of OR block 138 is fixed at 1 (i.e., independent of BCK). In that case, data is not propagated through register blocks 134 and 140, because the constant signals applied to their clock input ports CLK will not have any rising edges. When BIST testing is enabled, BIST is 1, and the output of OR block 138 is dictated by BCK. In that case, data will propagate through register blocks 134 and 140 at every rising edge in BIST clock signal BCK.

During BIST testing, during successive cycles of BIST clock BCK, words of output data (identified by the corresponding BIST read address value ARM) are sequentially read from memory block 102 via different output ports, with a different output port being read during each different clock cycle. These PR output data words QR are applied to the corresponding input ports of BIST output data mux block 130. For example, if there are four read ports, then it takes four clock cycles to update all of the data applied to BIST output data mux block 130. Note that, if the number of read ports PR in memory block 102 is less than four, then one or more of the higher numbered ports of BIST output data mux block 130 will not be utilized. BIST controller 144 updates the values of RMX0 and RMX1 at each clock cycle to sequentially select each of the different output data words QR applied to BIST output data mux block 130 so that each different output data word QR can be compared in comparator 142 to the expected data word generated based on ED0 and ED1.

Note that, when memory block 102 has only one read port, architecture 100 could be implemented without BIST output data mux block 130 and mux decoder 132, where the output data QR from that single read port is applied directly to data input D of register block 134. Alternatively, architecture 100 could be implemented with mux block 130 and mux decoder 132, where mux decoder 132 always selects the same input (e.g., input 0) of mux block 130 to which the single read port is connected.

As described above, comparator 142 performs a word-based comparison between the output data and the expected data. Such a word-based comparison is acceptable for many types of BIST testing (e.g., where BIST testing simply identifies whether the memory has any faults at all or is working perfectly). Where BIST testing needs to identify faults at a sub-word level, BIST testing can be designed to take advantage of the architecture's bit-write enable functionality to identify the location of faults at a sub-word level.

As shown in FIG. 1D, in addition to (1) providing particular inputs to other circuitry within architecture 100 (as described previously) and (2) receiving the match flag MF from comparator 142, BIST controller 144 also (i) receives control signals BIST and BFC from circuitry external to architecture 100 and (ii) provides output signals BC and BF to that external circuitry. The control signal BIST is the same BIST enable signal described previously, and the BIST flag BF is the same as the match flag MF generated by comparator 142. BIST controller 144 generates the BIST complete signal BC to indicate whether the current phase of BIST testing is ongoing (e.g., logical 1) or completed (e.g., logical 0).

The BIST function control signal BFC is used to control the duration of BIST retention testing. BIST retention testing typically has two phases: one phase for storing high signals (e.g., corresponding to logical 1s) and one phase for storing low signals (e.g., corresponding to logical 0s). When BFC is a logical 1, BIST controller 144 is able to initiate a phase of BIST retention testing. BFC goes from a logical 1 to a logical 0 to inform the BIST controller that the current phase of BIST retention testing is complete and to instruct the BIST controller to output the BIST flag BF to indicate the results of that testing.

All of the circuitry shown in FIG. 1 may be implemented in hardware on a single integrated circuit. Alternatively, one or more of the elements (e.g., BIST controller 144) could be implemented in software and/or off-chip.

Generalized BIST Algorithm

Memory architecture 100 of FIG. 1 can be used to implement a variety of different BIST algorithms. For example, BIST testing for memory architecture 100 might be designed to verify the proper operation of (a) each cell of memory block 102, (b) each write port address decoder in block 106, (c) each read port address decoder in block 114, (d) the bit-write enabling function in write buffers 110 for each write port, and (e) comparator 142.

Figure 3:
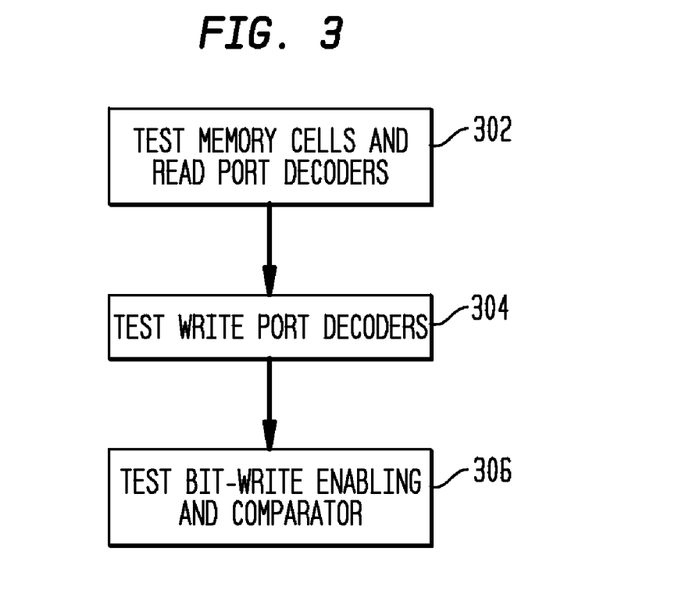
FIG. 3 shows a flow diagram of an exemplary BIST algorithm for the memory architecture of FIG. 1.

FIG. 3 shows a flow diagram of an exemplary BIST algorithm for memory architecture 100 of FIG. 1. The exemplary BIST algorithm of FIG. 3 has three phases: Phase 302 in which the memory cells and the read port decoders are tested, Phase 304 in which the write port decoders are tested, and Phase 306 in which bit-write enabling and the comparator are tested. Although not shown in FIG. 3, BIST testing could also include other phases, such as retention (hold-time) testing.

Figure 4A:
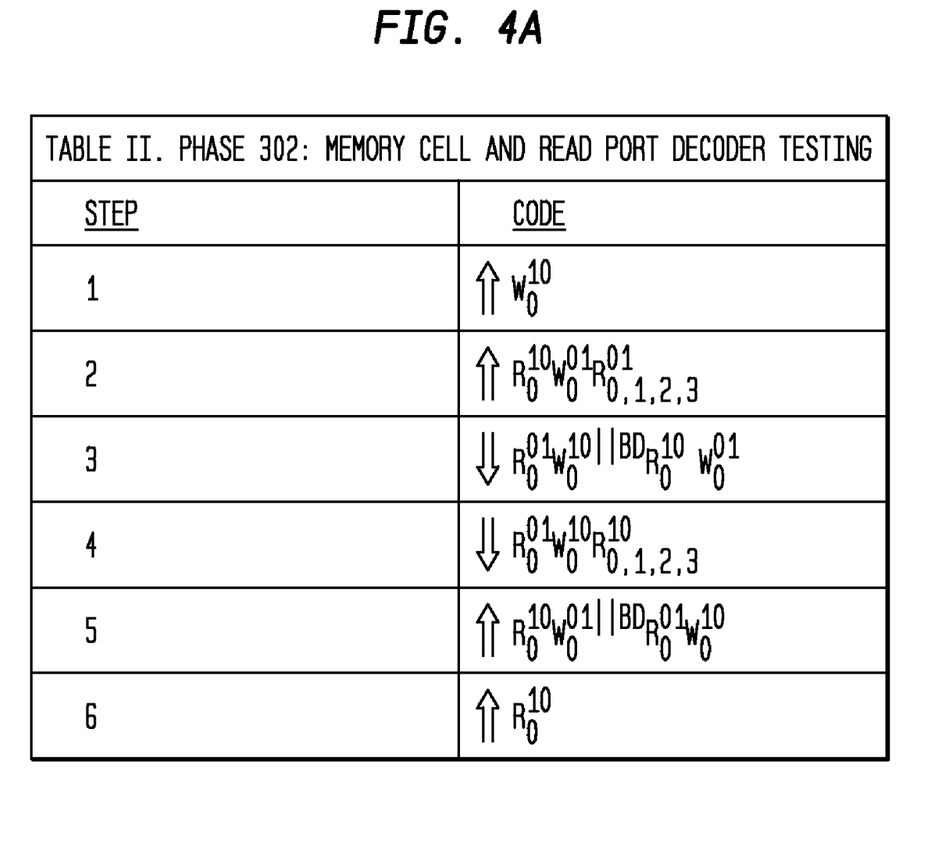
FIG. 4 shows Tables II, III, and IV, which present code for one possible implementation of BIST testing for the three phases of FIG. 3.

Table II in FIG. 4A presents code for one possible implementation of a BIST algorithm for the memory cell and read port decoder testing of Phase 302 of FIG. 3. In this particular code notation, for implementations that use certain types of address generators, such as those associated with binary counters, the symbol "⇑" indicates that processing proceeds incrementally from row 0 to row W−1 in memory block 102, while the symbol "⇓" indicates that the processing proceeds decrementally from row W−1 to row 0. For other types of address generators, such as those associated with gray codes or linear feed-back shift registers (LFSRs), the sequences of addresses might not increment (or decrement) linearly. As such, in general, the symbol "⇑" represents a particular sequence of addresses associated with the corresponding address generator, while the symbol "⇓" represents the corresponding reverse sequence of addresses.

The symbol "$Wk_j^{kl}$" corresponds to the writing of a specified bit pattern kl via write port j into the current word of memory block 102. Similarly, the symbol "$W_{i,\ldots,j}^{kl}$" corresponds to the sequential writing of bit pattern kl via write ports i through j into the current word of memory block 102.

Analogously, the symbol "$R_j^{kl}$" corresponds to (i) the reading of the data stored at the current word of memory block 102 via read port j and (ii) the comparison (by comparator 142) of that data to the specified bit pattern kl to determine whether the stored data matches that bit pattern. Similarly, the symbol "$R_{i,\ldots,j}^{kl}$" corresponds to (i) the sequential reading of the data stored at the current word of memory block 102 via read ports i through j and (ii) the comparison (by comparator 142) of that data to the specified bit pattern kl to determine whether the stored data matches that bit pattern.

The symbol "$W_j^{kl|BD}$" corresponds to the writing of a specified bit pattern kl via write port j into the current word of memory block 102 during a bit-disturbing (BD) operation. One type of bit-disturbing operation is to write data into one row, while reading data from another (e.g., adjacent) row. If a cell in the row being written to is not operating properly, then this simultaneous read/write operation can result in erroneous data being stored in that cell.

During Step 1 of Table II, at each row, starting from row 0 and incrementing to row W−1, bit pattern 10 is written into memory block 102 via write port 0, where bit pattern 10=( . . . 101010). At the end of Step 1, bit pattern 10 is stored in each row of memory block 102.

During Step 2 of Table II, at each row, starting from row 0 and incrementing to row W−1, (i) data is read from the current word via read port 0 and compared to bit pattern 10, (ii) bit pattern 01 is then written into the current word via write port 0, where bit pattern 01=( . . . 010101), (iii) data is then read from the current word via read port 0 and compared to bit pattern 01, (iv) data is then read from the current word via read port 1 and compared to bit pattern 01, (v) data is then read from the current word via read port 2 and compared to bit pattern 01, and lastly (vi) data is read from the current word via read port 3 and compared to bit pattern 01. At the end of Step 2, bit pattern 01 is stored in each row of memory block 102.

During Step 3 of Table II, at each row, starting from row W−1 and decrementing to row 0, (i) data is read from the current word via read port 0 and compared to bit pattern 01, (ii) bit pattern 10 is then written into the current word via write port 0 during a BD operation, (iii) data is then read from the current word via read port 0 and compared to bit pattern 10, and lastly (iv) bit pattern 01 is written into the current word via write port 0. At the end of Step 3, bit pattern 01 is stored in each row of memory block 102.

During Step 4 of Table II, at each row, starting from row W−1 and decrementing to row 0, (i) data is read from the current word via read port 0 and compared to bit pattern 01, (ii) bit pattern 10 is then written into the current word via write port 0, (iii) data is then read from the current word via read port 0 and compared to bit pattern 10, (iv) data is then read from the current word via read port 1 and compared to bit pattern 10, (v) data is then read from the current word via read port 2 and compared to bit pattern 10, and lastly (vi) data is read from the current word via read port 3 and compared to bit pattern 10. At the end of Step 2, bit pattern 10 is stored in each row of memory block 102.

During Step 5 of Table II, at each row, starting from row 0 and incrementing to row W−1, (i) data is read from the current word via read port 0 and compared to bit pattern 10, (ii) bit pattern 01 is then written into the current word via write port 0 during a BD operation, (iii) data is then read from the current word via read port 0 and compared to bit pattern 01, and lastly (iv) bit pattern 10 is written into the current word via write port 0. At the end of Step 3, bit pattern 10 is stored in each row of memory block 102.

During Step 6 of Table II, at each row, starting from row 0 and incrementing to row W−1, data is read from the current word via read port 0 and compared to bit pattern 10.

By the end of Phase 302 of Table II, the operations of each memory cell and each read port decoder will have been tested, during both normal and BD operations, using both bit patterns 10 and 01. In addition, the operations of the decoder for write port 0 will also have been tested.

Figure 4B:
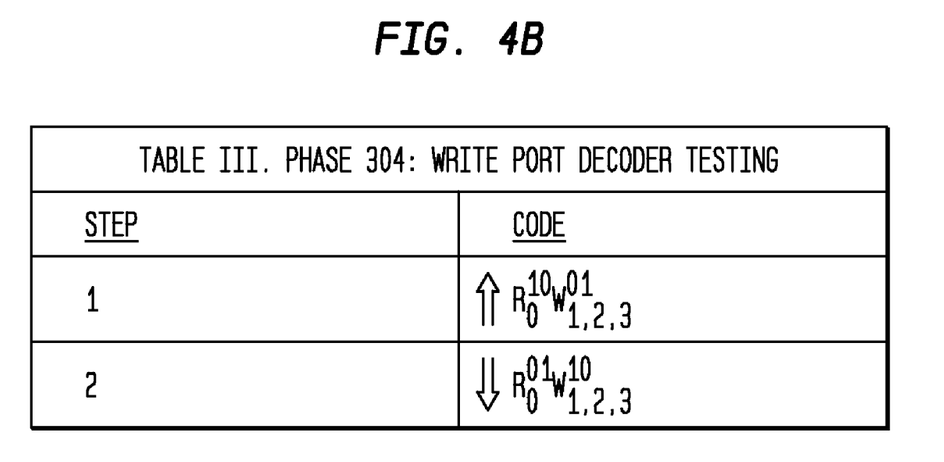

Table III in FIG. 4B presents code for one possible implementation of a BIST algorithm for the write port decoder testing of Phase 304 of FIG. 3. Steps 1 and 2 of Table III are implemented sequentially as a loop for each write port. That is, Step 1 is implemented for write port 1, then Step 2 is implemented for write port 1, then Step 1 is implemented for write port 2, then Step 2 is implemented for write port 2, then Step 1 is implemented for write port 3, and lastly Step 2 is implemented for write port 3.

More particularly, for the first pass through the loop, using write port 1, during Step 1 of Table III, at each row, starting from row 0 and incrementing to row W−1, (i) data is read from the current word via read port 0 and compared to bit pattern 10, and (ii) bit pattern 01 is then written into memory block 102. At the end of Step 1, bit pattern 01 is stored in each row of memory block 102. During Step 2 of Table III, still using write port 1, at each row, starting from row W−1 and decrementing to row 0, (i) data is read from the current word via read port 0 and compared to bit pattern 01, and (ii) bit pattern 10 is then written into memory block 102. At the end of Step 2, bit pattern 10 is stored in each row of memory block 102.

The loop of Steps 1 and 2 of Table III is then repeated using write port 2, and then repeated again using read port 3. By the end of Phase 304 of Table III, the operations of each write port decoder will have been tested.

Figure 4C:
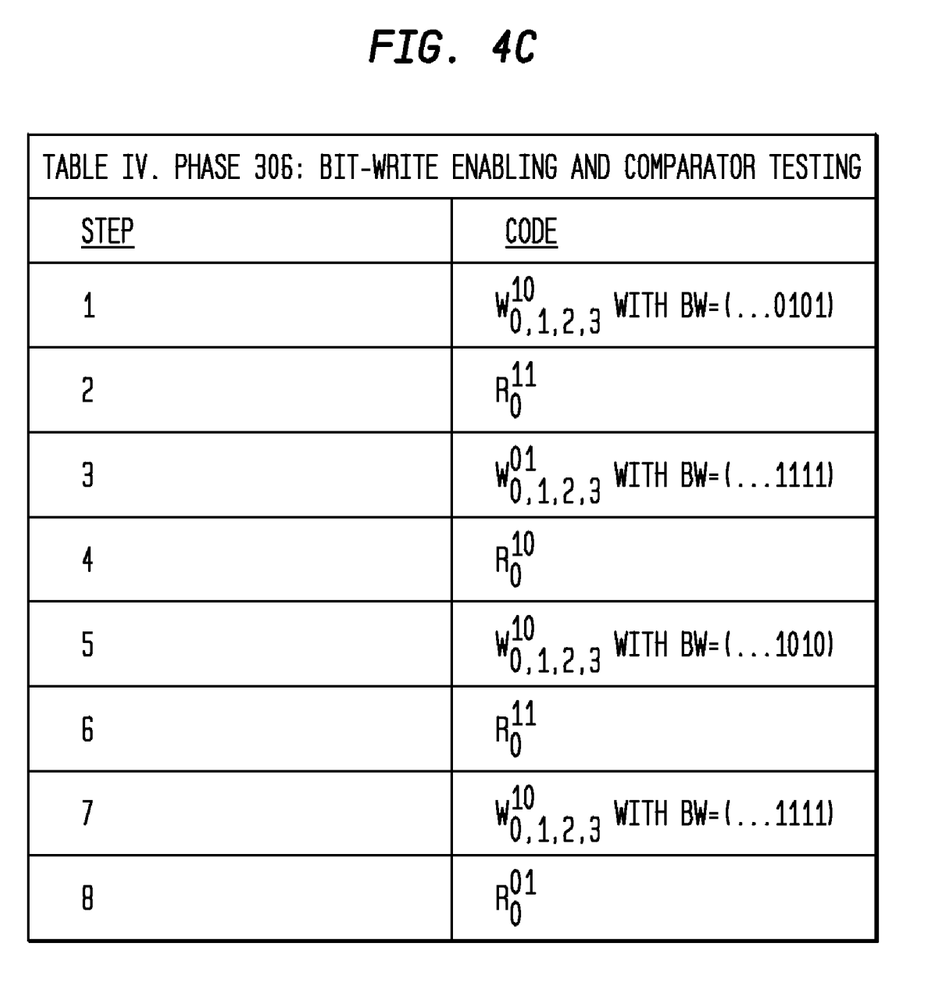

Table IV in FIG. 4C presents code for one possible implementation of a BIST algorithm for the bit-write enabling and comparator testing of Phase 306 of FIG. 3. As with the steps of Table III, Steps 1-8 of Table IV are implemented sequentially as a loop for each write port. That is, Steps 1-8 are implemented sequentially for write port 0, then Steps 1-8 are implemented sequentially for write port 1, then Steps 1-8 are implemented sequentially for write port 2, and lastly Steps 1-8 are implemented sequentially for write port 3. Note that the steps of Table IV are implemented for only a single row of memory block 102 (e.g., row 0).

More particularly, for the first pass through the loop, using write port 0, during Step 1 of Table IV, bit pattern 01 is written into row 0 of memory block 102 with bit-write enable signal BW=( . . . 0101), indicating that only the even bits are write-enabled. At the end of phase 304 of Table III, bit pattern 10 was stored in row 0 of memory block 102. As such, at the end of Step 1 of Table IV, row 0 contains bit pattern 11=( . . . 1111).

During Step 2 of Table IV, data is read from row 0 and compared to bit pattern 11.

During Step 3 of Table IV, bit pattern 01 is written into row 0 will all bits enabled.

During Step 4 of Table IV, data is read from row 0 and compared to bit pattern 10. In this case, comparator 142 should indicate that there is no match between the read data (i.e., bit pattern 01) and the "expected" data (bit pattern 10).

During Step 5 of Table IV, bit pattern 10 is written into row 0 with bit-write enable signal BW=( . . . 1010), indicating that only the odd bits are write-enabled. At the end of Step 4 of Table IV, bit pattern 01 was stored in row 0. As such, at the end of Step 5 of Table IV, row 0 contains bit pattern 11=( . . . 1111).

During Step 6 of Table IV, data is read from row 0 and compared to bit pattern 11.

During Step 7 of Table IV, bit pattern 10 is written into row 0 will all bits enabled.

During Step 8 of Table IV, data is read from row 0 and compared to bit pattern 01. As in Step 4, in Step 8, comparator 142 should indicate that there is no match between the read data (i.e., bit pattern 10) and the "expected" data (i.e., bit pattern 01).

The loop of Steps 1-8 of Table IV is then repeated using write port 1, then repeated again using write port 2, and lastly repeated again using read port 3. By the end of Phase 306 of Table IV, the operations of (i) bit-write enabling for each write port and (2) the comparator will have been tested.

The steps shown in Tables II-IV for Phases 302-306 of FIG. 3, respectively, correspond to a memory block having four write ports and four read ports. If a particular memory block has different numbers of write and/or read ports, then the algorithm of Tables II-IV should be appropriately modified. For example, if a particular memory block has only two write ports, then the subscripts of Steps 1-2 of Table III and Steps 1, 3, 5, and 7 of Table IV should be modified to drop references to write ports 2 and 3. Similarly, if a particular memory block has only three read ports, then the subscripts of Steps 2 and 4 of Table II should be modified to drop references to read port 3. By the same token, if a particular memory block has more than four write ports and/or more than four read ports, then the corresponding steps should be modified to add references to those additional ports. Note that, as mentioned earlier, the hardware of FIG. 1 would also need to be modified to accommodate more than four read ports.

Automatic Design of BIST Hardware

Figure 5:
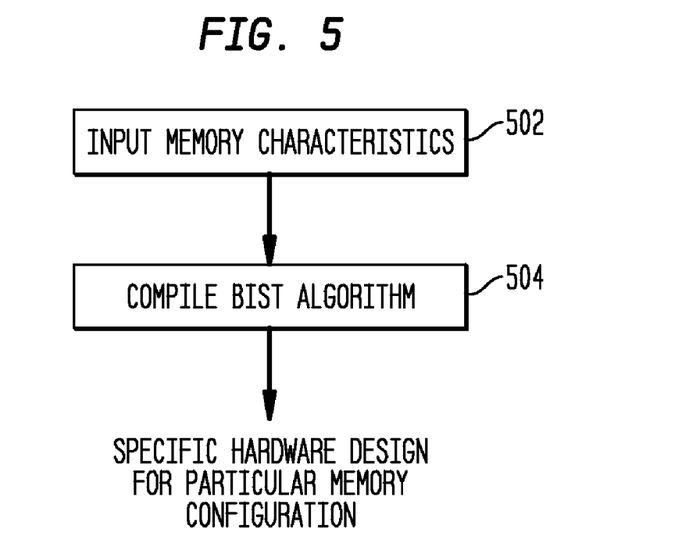
FIG. 5 shows a flow diagram of a design tool that can be used to generate specific hardware designs based on the generalized architecture of FIG. 1 and the BIST algorithm of FIGS. 3 and 4.

The generic natures of both the architecture of FIG. 1 and the algorithm of Tables II-IV enable the hardware design of a particular computer memory system to be generated using an automated (e.g., computer-implemented), off-line design tool. FIG. 5 shows the flow diagram for such a design tool.

At step 502 of FIG. 5, the parameters that identify the configuration characteristics of a particular computer memory system are specified. These include the number of write ports (PW), the number of read ports (PR), the number of words (W), and the number of bits per word (N) in the memory block.

At step 504, the design tool compiles the generic BIST algorithm of Tables II-IV based on the specified memory configuration characteristics to generate the hardware design for that particular memory system. Although not necessarily required, in a preferred implementation, the FSM for BIST controller 144 of FIG. 1D is based on a generic FSM design that applies to all supported hardware designs. This generic FSM uses counters to identify the currently selected read and write ports, where the FSM appropriately increments (i) the read-port counter from 1 to the specified value of the parameter PR and (ii) the write-port counter from 1 to the specified value of the parameter PW to control the BIST operations of the particular memory system.

The compilation performed by the design tool preferably takes into account the specified memory configuration characteristics to generate an efficient hardware design that has little if any excess hardware. Note that, in possible implementations of the design tool, when the memory block has only one read port, mux block 130 and mux decoder 132 might be included in hardware design even though, technically, they are not needed. In other implementations of the design tool, mux block 130 and mux decoder 132 might be excluded from the hardware design when the memory block has only one read port.

Depending on the particular implementation, additional constraints may be applied. For example, the range of possible memory configurations supported by the design tool could be limited to those having no more than a specified total number of ports (e.g., five). Such a constraint is indicated in the last three rows of Table I in FIG. 2, where the number of write ports (PW) can be anywhere from one to four, the number of read ports (PR) can be anywhere from one to four, and the total number of ports (PW+PR) can be anywhere from two to five. Note that this particular constraint assumes that each port is either a write-only port or a read-only port.

Although BIST testing has been described in the context of the architecture of FIG. 1 and the algorithm of FIGS. 3 and 4, it should be understood (1) that the architecture of FIG. 1 can support different BIST algorithms and (2) that the algorithm of FIGS. 3 and 4 can be implemented using different BIST hardware designs. For example, the algorithm of FIGS. 3 and 4 can be implemented using a BIST hardware design that has a different comparator for each different read port (as opposed to the single, multiplexed comparator of FIG. 1C).

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

We claim:

1. A computer-implemented method, implemented by a computer-based, automated design tool, for designing BIST circuitry for testing a memory having one or more write ports and one or more read ports, the computer-implemented method comprising:
   (a) receiving, by the design tool, one or more values for one or more memory configuration parameters for the memory, the one or more memory configuration parameters comprising a number of write ports for the memory and a number of read ports for the memory; and
   (b) generating, by the design tool, a hardware design for the BIST circuitry by the design tool compiling a generic BIST algorithm based on the numbers of read and write ports for the memory.

2. The method of claim 1, wherein:
   the design tool is limited to designing the BIST circuitry having a maximum value for the total number of write and read ports; and
   step (a) comprises receiving the numbers of write and read ports, wherein the sum of the received numbers of write and read ports is less than or equal to the maximum value.

3. The method of claim 1, wherein:
   the one or more memory configuration parameters further comprise a number of bits per memory entry and a number of entries in the memory;
   step (a) further comprises receiving values for the number of bits per memory entry and the number of entries in the memory; and
   step (b) further comprises generating, by the design tool, the hardware design for the BIST circuitry by the design tool compiling the generic BIST algorithm based on the number of bits per memory entry and the number of entries in the memory.

4. The method of claim 1, wherein:
   the design tool is adapted to compile the generic BIST algorithm based on different sets of the memory configuration parameter values to generate different BIST circuitry hardware designs corresponding to different memory configurations; and
   the method further comprises:
     (c) receiving, by the design tool, one or more different values for one or more memory configuration parameters for a different memory configuration; and
   (d) generating, by the design tool, a different hardware design for different BIST circuitry by the design tool compiling the generic BIST algorithm based on the one or more different values for the one or more memory configuration parameters for the different memory configuration.

5. The method of claim 4, wherein:
   the design tool is limited to designing the BIST circuitry having a maximum value for the total number of write and read ports; and
   step (a) comprises receiving the numbers of write and read ports, wherein the sum of the received numbers of write and read ports is less than or equal to the maximum value.

6. The method of claim 1, wherein step (b) comprises generating, by the design tool, the hardware design for the BIST circuitry to test (i) memory cells in the memory, (ii) one or more read port decoders for the memory, and (iii) one or more write port decoders for the memory.

7. The lull method of claim 6, wherein step (b) comprises generating, by the design tool, the hardware design for the BIST circuitry to further test (iv) bit-write enabling for the memory and (v) a comparator of the BIST circuitry.

8. The method of claim 7, wherein the step (b) comprises generating, by the design tool, the hardware design for the BIST circuitry to perform BIST testing that comprises:
   a first test phase adapted to test the memory cells and the one or more read port decoders;
   a second test phase adapted to test the one or more write port decoders; and
   a third test phase adapted to test the bit-write enabling and the comparator.

9. The method of claim 6, wherein:
   the memory has two or more write ports and two or more write port decoders; and
   step (b) comprises generating, by the design tool, the hardware design for the BIST circuitry to perform BIST testing for the write port decoders that involves cycling through the different write port decoders.

10. The method of claim 6, wherein:
    the memory has two or more read ports and two or more read port decoders; and
    step (b) comprises generating, by the design tool, the hardware design for the BIST circuitry to perform BIST testing for the read port decoders that involves cycling through the different read port decoders.

11. The method of claim 1, wherein:
    the memory has multiple read ports; and
    step (b) comprises:
      (b1) including, in the hardware design for the BIST circuitry, a multiplexer block adapted to receive data from each of the multiple read ports and output selected data from one of the multiple read ports; and
      (b2) including, in the hardware design for the BIST circuitry, a comparator adapted to compare the selected data from the multiplexer block with expected data to determine whether the selected data matches the expected data.

12. The method of claim 11, wherein step (b) further comprises including, in the hardware design for the BIST circuitry, a controller adapted to generate and update a mux select signal to cause the multiplexer block to sequentially select data from different ones of the multiple read ports.

13. The storage medium of claim 1, wherein the design tool generates the hardware design for the BIST circuitry to accommodate port to port interactions.

14. A non-transitory computer-readable storage medium, having encoded thereon program code, wherein, when the program code is executed by a computer, the computer implements a design tool for designing BIST circuitry for testing a memory having one or more write ports and one or more read ports, wherein the design tool:
    receives one or more values for one or more memory configuration parameters for the memory, the one or more memory configuration parameters comprising a number of write ports for the memory and a number of read ports for the memory; and
    generates a hardware design for the BIST circuitry by compiling a generic BIST algorithm based on the numbers of read and write ports for the memory.

15. The storage medium of claim 14, wherein the design tool generates the hardware design for the BIST circuitry to test (i) memory cells in the memory, (ii) one or more read port decoders for the memory, and (iii) one or more write port decoders for the memory.

16. The storage medium of claim 15, wherein the design tool generates the hardware design for the BIST circuitry to further test (iv) bit-write enabling for the memory and (v) a comparator of the BIST circuitry.

17. The storage medium of claim 16, wherein the the design tool generates the hardware design for the BIST circuitry to perform BIST testing that comprises:
    a first test phase adapted to test the memory cells and the one or more read port decoders;
    a second test phase adapted to test the one or more write port decoders; and
    a third test phase adapted to test the bit-write enabling and the comparator.

18. The storage medium of claim 15, wherein:
    the memory has two or more write ports and two or more write port decoders; and
    the design tool generates the hardware design for the BIST circuitry to perform BIST testing for the write port decoders that involves cycling through the different write port decoders.

19. The storage medium of claim 15, wherein:
    the memory has two or more read ports and two or more read port decoders; and
    the design tool generates the hardware design for the BIST circuitry to perform BIST testing for the read port decoders that involves cycling through the different read port decoders.

20. The storage medium of claim 14, wherein the design tool generates the hardware design for the BIST circuitry to accommodate port to port interactions.

21. A method for designing BIST circuitry for testing a memory having one or more write ports and one or more read ports, the method comprising:
    assigning one or more values for one or more memory configuration parameters for the memory; and
    compiling a generic BIST algorithm based on the one or more memory configuration parameters to generate a design for the BIST circuitry, the generic BIST algorithm adapted to test i) memory cells in the memory, ii) one or more read port decoders for the memory, iii) one or more write port decoders for the memory, and iv) bit-write enabling for the memory and a comparator of the BIST circuitry, the generic BIST algorithm comprising:
        a first test phase adapted to test the memory cells and the one or more read port decoders;
        a second test phase adapted to test the one or more write port decoders; and
        a third test phase adapted to test the bit-write enabling and the comparator.

22. A method for designing BIST circuitry for testing a memory having one or more write ports and one or more read ports, the method comprising:
    assigning one or more values for one or more memory configuration parameters for the memory, the memory including two or more write ports and two or more write port decoders;
    compiling a generic BIST algorithm based on the one or more memory configuration parameters to generate a design for the BIST circuitry, the generic BIST algorithm adapted to test memory cells in the memory, one or more read port decoders for the memory, and the write port decoders for the memory; and
    testing for the write port decoders involves cycling through the different write port decoders.

23. A method for designing BIST circuitry for testing a memory having one or more write ports and one or more read ports, the method comprising:
    assigning one or more values for one or more memory configuration parameters for the memory, the memory including two or more read ports and two or more read port decoders;
    compiling a generic BIST algorithm based on the one or more memory configuration parameters to generate a design for the BIST circuitry, the generic BIST algorithm adapted to test memory cells in the memory, the read port decoders for the memory, and one or more write port decoders for the memory; and
    testing for the read port decoders involves cycling through the different read port decoders.

* * * * *